(12) United States Patent
Shin et al.

(10) Patent No.: US 6,304,484 B1
(45) Date of Patent: Oct. 16, 2001

(54) MULTI-BIT FLASH MEMORY CELL AND PROGRAMMING METHOD USING THE SAME

(75) Inventors: Jin Shin, Seoul; Sang Hoan Chang, Kyungki-Do; Seoung Ouk Choi, Kyungki-Do; Keon Soo Shim, Kyungki-Do, all of (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/722,111

(22) Filed: Nov. 27, 2000

(30) Foreign Application Priority Data

Dec. 27, 1999 (KR) .................................................. 99-62956

(51) Int. Cl.7 .......................... G11C 16/04; H01L 29/788
(52) U.S. Cl. ................................. 365/185.03; 365/185.05; 365/185.17; 257/315; 257/316
(58) Field of Search ........................... 365/185.03, 185.1, 365/185.14, 185.05, 185.17; 257/315, 316

(56) References Cited

U.S. PATENT DOCUMENTS

| | | | |
|---|---|---|---|
| 5,753,945 | * 5/1998 | Kojima | 257/315 |
| 5,789,777 | * 8/1998 | Kojima | 257/314 |
| 5,949,711 | * 9/1999 | Kazerounian | 365/185.05 |
| 5,999,453 | * 12/1999 | Kawata | 365/185.18 |
| 6,151,248 | * 11/2000 | Harari et al. | 365/184.14 |

* cited by examiner

*Primary Examiner*—Son T. Dinh
(74) *Attorney, Agent, or Firm*—Pennie & Edmonds LLP

(57) ABSTRACT

There is disclosed a multi-bit flash memory cell and programming method using the same. In order to solve the problems that the size of a cell per unit is increased, reliability of a device is degraded due to a high operating voltage and a circuit necessary for driving the cell becomes complicated, the multi-bit flash memory cell and programming method using the same according to the present invention stores information of various states, by interchangeably programs a drain and a source in a cell array of virtual ground type, in a structure in which that two types of cells look like connected serially by doping a floating gate in a flash memory cell with two regions of a N type and a P to type.

12 Claims, 2 Drawing Sheets

MULTI-BIT FLASH MEMORY CELL AND PROGRAMMING METHOD USING THE SAME

FIELD OF THE INVENTION

The invention relates generally to a flash memory cell. More particularly, it relates to a multi-bit flash memory cell and programming method using the same capable of storing information of more than 2 states at a single flash memory cell.

BACKGROUND OF THE INVENTION

In a conventional memory cell, 1 bit, i.e., only 2 states could be stored at a single memory cell. Thus, in order to reduce the size of a chip, the size of the chip per unit must be reduced. In order to reduce the size of the chip per unit, however, difficulties in various processes are accompanied its cost is increased. Therefore, if data of more than two bits is stored at a single cell, the size of the cell could be reduced to more than half.

In a flash memory cell, there have attempted to develop thus multi-bit cell. Recently, cells implemented in various methods have been reported. As one of the methods reported conventionally, there exists a method by which a floating gate is divided into more than two and the number of electrons in the floating gate is adjusted depending on the programming condition to implement a multi-bit cell. This method, however, is difficult in process and increases the size of the cell per unit, thus counterbalancing the advantage of implementing a multi-bit cell. Also, there is a difficulty in constructing a circuit because the method requires a high voltage upon programming. Further, there is a possibility that reliability of the device is degraded because the method uses a high voltage inside the circuit.

As another method for implementing a multi-bit cell, there is a method of manufacturing a cell, by defining a program verification condition corresponding to 4 states while controlling a program bias or a pulse. This method, however, makes circuits for implementing various program conditions complicated. Further, if the program verification condition is subdivided to perform a program, there is a disadvantage that the time required for the program verification becomes long.

SUMMARY OF THE INVENTION

It is therefore an object of the present invention to provide a multi-bit flash memory cell and programming method using the same, which can store information of various states by interchangeably programming a drain and a source in a cell array of virtual ground type, in a structure in which that two types of cells look like connected serially by doping a floating gate in a flash memory cell with two regions of a N type and a P type.

In order to accomplish the above object, a multi-bit flash memory cell according to the present invention is characterized in that it comprises a floating gate electrically isolated from a semiconductor substrate by a gate oxide film, one side of the floating gate has a first doping region and the other side of the floating gate has a second doping region, a control gate electrically isolated from the floating gate by a dielectric film and overlapped with the floating gate in a self alignment manner, a first junction region formed at the semiconductor substrate outside the first doping region in the floating gate, and a second junction region formed at the semiconductor substrate outside the second doping region in the floating gate.

Also, a method of programming a multi-bit flash memory cell according to the present invention, having a structure in which a floating having N-type and P-type doping regions is formed, a gate electrode consisted of a control gate formed on said floating gate is formed and first and second junction regions are formed on both sides of said gate electrode is characterized in that assuming that an initial state where a programming operation is not performed is a '00' state, the first junction region and the second junction region are programmed with a '01' state and a '11' state, respectively, by switching a source voltage and a drain voltage applied to the first and second junction regions, respectively; and the first junction region and the second junction region are programmed with a '11' state by applying a programming voltage for a longer time than when the programming into the '10' state is performed.

The present invention forms a floating gate wherein two regions; a N-type doping region and a P-type doping region are divided when forming polysilicon used for a floating gate. In case that a gate material of a N-type is used, the threshold voltage can be differently adjusted since its work function is different from that of a substrate. In this case, the programming efficiency of the N-type doping side and the P-type doping side is different. Thus, if they are programmed under same conditions, their thresholds to be attained are different. The present invention can use the difference of the threshold voltages thus implemented differently as the threshold voltage in the intermediate step and uses a general erase state and a general program state as an erase state and a complete program state, respectively. The general program state performs the programming using the junction having good program efficiency as a drain side.

At this time, the verification condition is same to the complete program state. Thus implemented cell performs the programming operation while the source and the drain are switched when viewed from the unit cell. Therefore, it can select the source and the drain depending on the program condition, since the array is constructed in a virtual ground type.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 1:
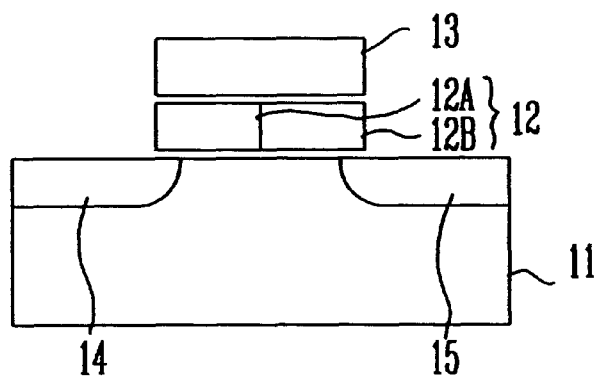
FIG. 1 is a cross-sectional view of a multi-bit flash memory cell according to the present invention.

FIG. 1 is a cross-sectional view of a multi-bit flash memory cell according to the present invention, which shows a flash memory cell of a stack-gate type.

As shown, the multi-bit flash memory cell according to the present invention includes a floating gate 12 electrically isolated from a semiconductor substrate 11 by a gate oxide film (not shown) and one side of which has a first doping region 12A and the other side of which has a second doping region 12B, a control gate 13 formed on and electrically isolated from the floating gate 12 by a dielectric film (not shown) and overlapped with the floating gate 12 in a self alignment manner, a first junction region 14 formed at the semiconductor substrate 11 outside the first doping region 12A in the floating gate 12 and a second junction region 15 formed at the semiconductor substrate 11 outside the second doping region 12B in the floating gate 12. At this time, the first doping region 12A and the second doping region 12B have the same lengths. That is, if the length of the floating gate 12 is L, the floating gate 12 is doped so that the length of the first doping region 12A and the second doping region 12B is L/2, respectively. The first doping region 12A may be, for example, N-type, and the second doping region 12B may be, for example, P-type.

A hot carrier injection is used to program the multi-bit flash memory cell having this structure and a channel erase using a F-N tunneling is also used to erase it. At this time, the erase is almost same to a method of erasing a typical flash memory cell and is same to a typical programming method. However, the programming efficiency is different in the case that the first junction region 14 is used as a drain and the case that the second junction region 15 is used as a drain. Thus, if they are programmed by the same program bias for same time, the threshold voltage to be attained will be different. As mentioned above, the present invention implements a 2-bit cell using the two different threshold voltages as two states in the intermediate step. In this programming method, the reason why the program efficiencies are different, when they are programmed by changing their junctions each other, will be below explained by reference to FIG. 2.

Figure 2:
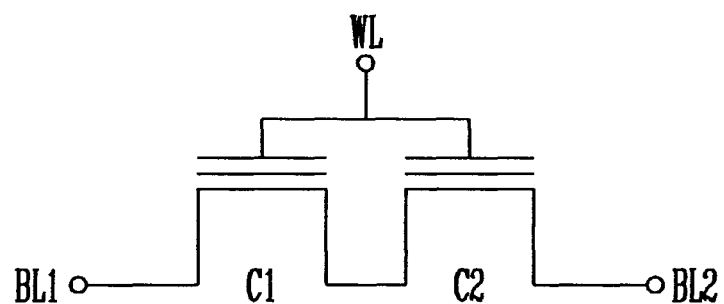
FIG. 2 shows an equivalent circuit diagram of a multi-bit flash memory cell according to the present invention.

FIG. 2 shows an equivalent circuit diagram of a multi-bit flash memory cell according to the present invention.

The flash memory cell has a structure in which two cells C1 and C2 each having different threshold voltages are serially connected between a bit line BL1 and a bit line BL2, as shown in FIG. 2. The control gates of the first and second cells C1 and C2, connected each other, are connected to a word line WL. For example, the first cell C1 formed by the first doping region 12A doped with a N-type impurity has a low voltage while the second cell C2 formed by the second doping region 12B doped with a P-type impurity has a high voltage. Due to the threshold voltage between the first cell C1 and the second cell C2, the carrier concentration in the junction edge portion where channel concentration and hot carrier injection are generated under a programming condition, is different. Therefore, as the probability by which the hot carrier injection is generated and the probability by which the carriers pass over the barrier into the floating gate are different, their final programming efficiencies become different. At this time, it can be considered that the junction structure per cell is changed to differentiate the programming efficiency using this principle. However, it should be noted that the size of the cell might be increased since both the junctions become asymmetric.

Figure 3:
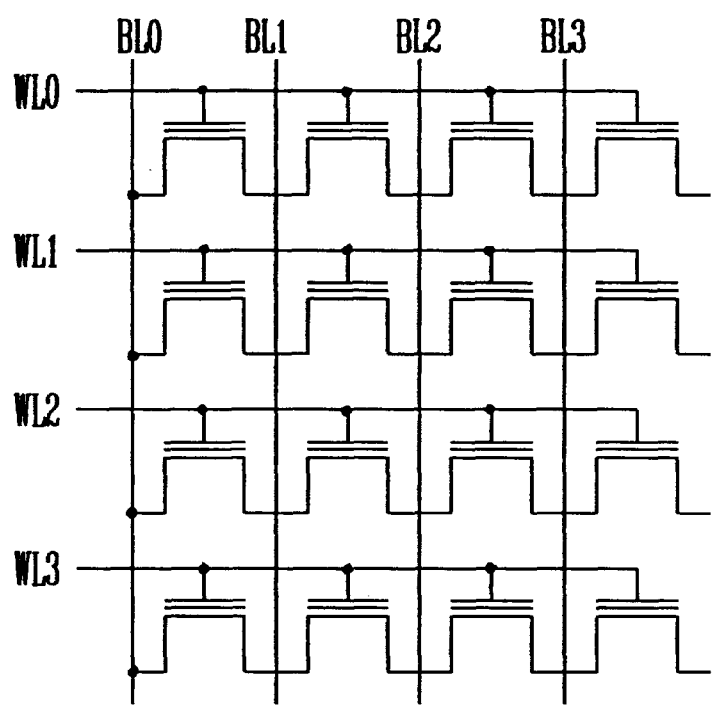
FIG. 3 shows a structure of a multi-bit flash memory cell according to the present invention.

FIG. 3 shows a structure of a multi-bit flash memory cell according to the present invention.

As mentioned above, if the programming is to be performed by changing the drain and the source, the unit cell array must have a virtual ground array structure so that the programming can be performed while the ground lines are changed interchangeably. The virtual ground array structure is one in which cells neighboring the same lines (bit lines) are used as a source or a drain. A small cell array may be implemented using this cell array structure.

FIGS. 4A to 4D are a programming condition depending on respective states of multi-bit flash memory cells and a graph showing the relationship between a gate voltage and a drain current at this time.

As shown, the flash memory cell according to the present invention has a structure in which a floating gate 42 having first and second doping regions 42A and 42B is formed on a semiconductor substrate 41, a control gate 43 is formed on the floating gate 42 to form a stack gate, and first and second junction regions 44 and 45 are formed on both sides of the gate electrode 42.

Figure 4A:
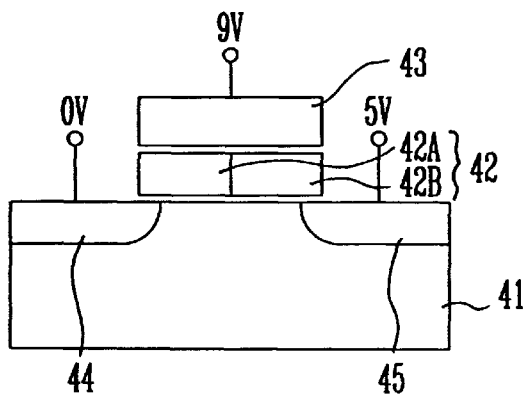
FIGS. 4A to 4D are a programming condition depending on respective states of multi-bit flash memory cells and a graph showing the relationship between a gate voltage and a drain current at this time.
Figure 4B:
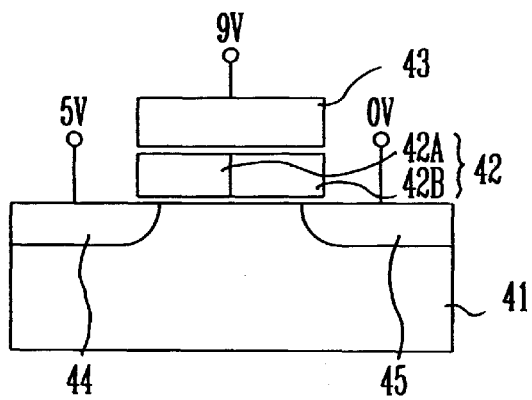
Figure 4C:
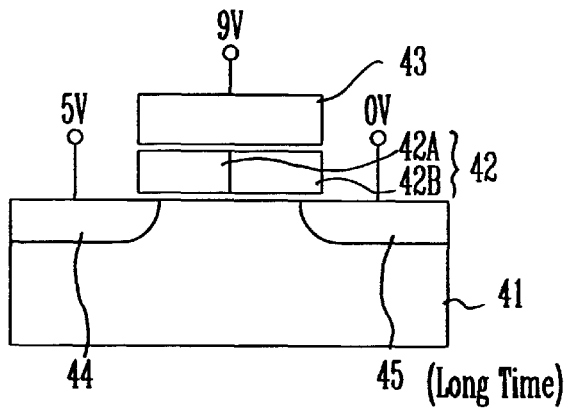
Figure 4D:
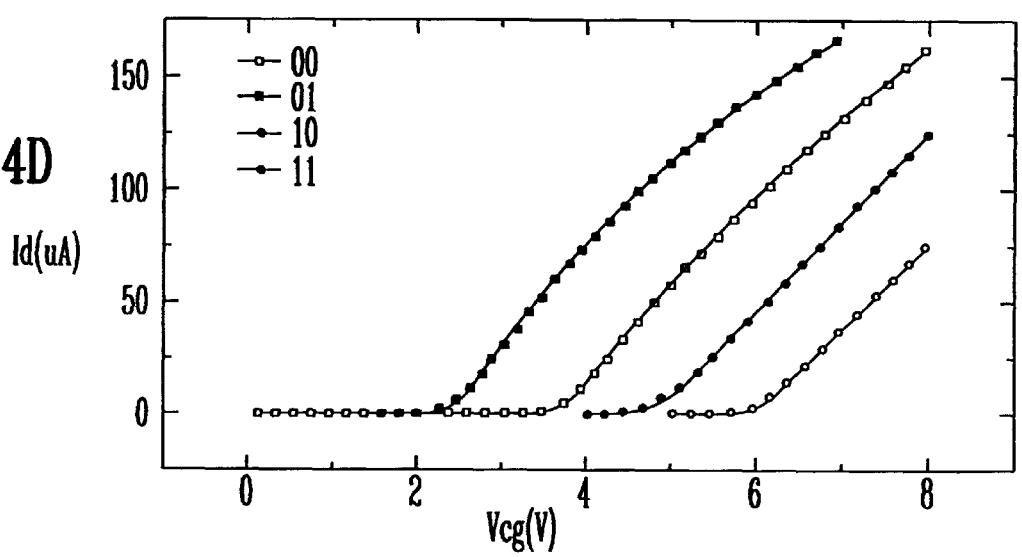

FIGS. 4A~4D show '01', '10' and '11', respectively, where the initial state is '00' when a programming is not performed. In order for the multi-bit flash memory cell according to the present invention to have the '01' state, a programming operation by which a voltage of 0V is applied to the source, a voltage of 3V~8V is applied to the drain and a voltage of 5~15V is applied to the control gate, is performed using the junction region 45 formed on the semiconductor substrate outside the second doping region 42B (P-type doping region) having a high threshold voltage in the floating gate 42, as the drain, and using the junction region 44 as the source. Also, in order for the multi-bit flash memory cell to have the '10' state, a programming operation by which a voltage of 0V is applied to the source, a voltage of 3V~8V is applied to the drain and a voltage of 5~15V is applied to the control gate, is performed using the junction region 44 formed on the semiconductor substrate outside the first doping region 42A (N-type doping region) having a low threshold voltage in the floating gate 42, as the drain, and using the junction region 45 as the source. Finally, in order for the multi-bit flash memory cell to have the '11' state, a programming operation by which a voltage of 0V is applied to the source, a voltage of 3V~8V is applied to the drain and a voltage of 5~15V is applied to the control gate, for a longer time than the case where the programming is performed in the '10' state, using the junction region 44 formed on the semiconductor substrate outside the first doping region 42A (N-type doping region) having a low threshold voltage in the floating gate 42, as the drain, and using the junction region 45 as the source. Under these programming conditions, the conditions on the '10' state and the '01' state can be exchanged. FIG. 4D shows the relationship between the control gate voltage Vcg and the drain current Id depending on respective states.

The present invention basically uses the difference of the programming efficiency in the source side and the drain side in order for the flash memory to store information of more than 1 bit. However, the present invention is not limited to the above embodiment but it can be applied to a method of generating the difference of the programming efficiency by changing the junction structure. In other words, the method makes the junction structure of the source and the drain different, thus making different their programming efficiency (one side is an abrupt junction and the other is a graded junction). Also, though the above-mentioned embodiment has described a stack gate type flash memory cell as an example, it may be also applied to a split gate cell.

As described above, the present invention can reduce the area of a cell array with respect to the same cell size to its half since it can store information of 2 bits per cell. Also, the present invention can reduce the processes since it can manufacture a multi-level cell by adopting the so method of manufacturing a conventional NOR type cell intact and can also implement a multi-level cell using one type of program bias. Further, the present invention can prevent a leak current by increasing the threshold voltage in some channel regions of a cell using a P-type impurity doped polysilicon as a gate. Additionally, there are problems that the leak current of a cell is increased due to a weaken drain turn-on phenomenon or source/drain characteristic, etc. However, the present invention can reduce the leak current in the same channel concentration by using some of the floating gate as a P-type impurity doped polysilicon.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A multi-bit flash memory cell, comprising:
   a floating gate electrically isolated from a semiconductor substrate by a gate oxide film, one side of said floating gate has a first doping region and the other side of said floating gate has a second doping region;
   a control gate electrically isolated from said floating gate by a dielectric film and overlapped with said floating gate in a self alignment manner;
   a first junction region formed at said semiconductor substrate outside said first doping region in said floating gate; and
   a second junction region formed at said semiconductor substrate outside said second doping region in said floating gate.

2. The multi-bit flash memory cell according to claim 1, wherein the first and second doping regions are have the same length.

3. The multi-bit flash memory cell according to claim 1, wherein the first and second doping regions are doped differently and are formed by injecting different types of impurities.

4. A multi-bit flash memory cell, comprising:
   a semiconductor substrate;
   a gate oxide film formed on the semiconductor substrate;
   a floating gate formed on the gate oxide film and thereby electrically isolated from the semiconductor substrate, the floating gate having differently doped first and second doping regions arranged side-by-side;
   a dielectric film formed on the floating gate;
   a control gate formed on the dielectric film and thereby electrically isolated from the floating gate, with the control gate overlying the floating gate;
   a first junction region formed at the semiconductor substrate outside the first doping region; and
   a second junction region formed at the semiconductor substrate outside the second doping region.

5. The multi-bit flash memory cell according to claim 4, wherein the first and second doping regions have the same length.

6. The multi-bit flash memory cell according to claim 5, wherein the first and second doping regions are doped with different types of impurities.

7. The multi-bit flash memory cell according to claim 4, wherein:
   applying, for a first predetermined period of time, a first voltage to the first junction, a second voltage to the second junction and a third voltage to the control gate causes the cell to enter a first state; and
   applying, for a second predetermined period of time, said second voltage to the first junction, said first voltage to the second junction and said third voltage to the control gate causes the cell to enter a second state.

8. The multi-bit flash memory cell according to claim 7, wherein:
   applying, for a third predetermined period of time longer than the second period of time, said second voltage to the first junction, said first voltage to the second junction and said third voltage to the control gate causes the cell to enter a third state.

9. The multi-bit flash memory cell according to claim 8, wherein the first state is a '01' state, the second state is a '10' state and the third state is a '11' state.

10. The multi-bit flash memory cell according to claim 7, wherein the first voltage is 0 V, the second voltage is 3 V to 8V and the third voltage is 5 V to 15 V.

11. A method of programming a multi-bit flash memory cell having a structure in which a floating gate having N-type and P-type doping regions is formed, a gate electrode comprising a control gate formed on said floating gate is formed and first and second junction regions are formed on either side of said gate electrode, the method comprising:
   assuming that an initial state where a programming operation is not performed is a '00' state, said first junction region and said second junction region are programmed with a '01' state and a '10' state, respectively, by switching a source voltage and a drain voltage applied to said first and second junction regions, respectively; and said first junction region and said second junction region are programmed with a '11' state by applying a programming voltage for a longer time than when the programming into the '10' state is performed.

12. The method of programming a multi-bit flash memory cell according to claim 11, wherein said programming operation includes applying a voltage of 0 V to the source, a voltage of 3 V to 8 V to the drain, and a voltage of 5 to 15 V to the control gate.

* * * * *